(12) United States Patent
Park (10) Patent No.: US 7,838,898 B2
(45) Date of Patent: Nov. 23, 2010

(54) LIGHT EMITTING DIODE MODULE AND DISPLAY DEVICE HAVING THE SAME

(75) Inventor: Mun-soo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 12/011,958

(22) Filed: Jan. 29, 2008

(65) Prior Publication Data

US 2008/0185607 A1 Aug. 7, 2008

(30) Foreign Application Priority Data

Feb. 5, 2007 (KR) .................... 10-2007-0011649

(51) Int. Cl.
*H01L 33/00* (2010.01)
(52) U.S. Cl. .............................. 257/99; 257/13; 257/84; 257/E33.001
(58) Field of Classification Search ................ 257/13, 257/79–103, 918, E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 7,258,464 B2 * | 8/2007 | Morris et al. ............... | 362/264 |
| 2002/0145152 A1 * | 10/2002 | Shimomura ................. | 257/98 |
| 2008/0099770 A1 * | 5/2008 | Mendendorp et al. ......... | 257/79 |

FOREIGN PATENT DOCUMENTS

| | | |
|---|---|---|
| JP | 11-167358 | 6/1999 |
| JP | 2001-284659 | 10/2001 |
| JP | 2003-152225 | 5/2003 |
| JP | 2006-100316 | 4/2006 |

OTHER PUBLICATIONS

English Language Abstract, Publication No. JP11167358, Jun. 22, 1999, 1 p.
English Language Abstract, Publication No. JP2001284659, Oct. 12, 2001, 1 p.
English Language Abstract, Publication No. JP2003152225, May 23, 2003, 1 p.

* cited by examiner

*Primary Examiner*—N Drew Richards
*Assistant Examiner*—Mamadou Diallo
(74) *Attorney, Agent, or Firm*—Innovation Counsel LLP (57) ABSTRACT

A light emitting diode (LED) module which includes a light emitting diode which includes a light emitting chip, a first electrode and a second electrode, the first and second electrodes being electrically connected to the light emitting chip. The light-emitting diode is supported on a printed circuit board. The printed circuit board includes a base substrate of an insulating resin material, a first extension electrode that is formed on the base substrate and is connected to the first electrode, and a second extension electrode that is formed on the base substrate and is connected to the second electrode.

23 Claims, 9 Drawing Sheets

LIGHT EMITTING DIODE MODULE AND DISPLAY DEVICE HAVING THE SAME

CROSS-REFERENCE TO RELATED APPLICATIONS

This application claims priority from Korean Patent Application No. 10-2007-0011649, filed on Feb. 5, 2007 in the Korean Intellectual Property Office, the disclosure of which is incorporated herein by reference.

BACKGROUND OF INVENTION

1. Field of Invention

Apparatuses consistent with the present invention relate to a light emitting diode module and a display device having the same, and more particularly, to a light emitting diode module with improved heat radiation efficiency and increased productivity, and a display module having the same.

2. Description of the Related Art

In recent years, among various kinds of display devices, with rapid development of semiconductor technology, liquid crystal display (LCD) devices have been popularized with their miniaturization, lightness and improved performance.

At present, the liquid crystal display devices are being employed and used for almost all information processing devices including middle or large-sized products such as monitors, TVs and the like as well as small-sized products such as mobile phones, personal digital assistants (PDAS), portable multimedia players (PMPs) and the like.

A liquid crystal display panel is a non-emissive type display panel that can not emit light by itself, and accordingly, the liquid crystal display device requires a backlight assembly that supplies light to the rear side of the liquid crystal display panel.

The backlight assembly has used a cold cathode fluorescent lamp (CCFL), an external electrode fluorescent lamp (EEFL) or the like as a light source, but in recent years, has mainly used a light emitting diode (LED) as a light source. The light emitting diode may be used singly or a plurality of light emitting diodes may be moduled.

However, if the light emitting diode is used for the light source, a lot of heat may be generated, which may cause defects of the light emitting diode or have an adverse effect on a display device.

In recent years, a light emitting diode module using a metal core printed circuit board (MCPCB) advantageous for heat radiation has been developed and used to effectively radiate heat generated in the light emitting diode.

However, this light emitting diode module has a problem of high product costs, low productivity and difficulty of repair for defects.

SUMMARY OF THE INVENTION

Accordingly, it is an aspect of the present invention to provide a light emitting diode module with improved heat radiation efficiency and increased productivity.

Another aspect of the present invention is to provide a display device having the above light emitting diode module.

Additional aspects of the present invention will be set forth in part in the description which follows and, in part, will be obvious from the description, or may be learned by practice of the present invention.

The foregoing and/or other aspects of the present invention can be achieved by providing a light emitting diode (LED) module including: a light emitting diode which includes a light emitting chip, a first electrode and a second electrode, the first and second electrodes being electrically connected to the light emitting chip; and a printed circuit board on which the light emitting diode is mounted, the printed circuit board including: a base substrate which includes an insulating resin material; a first extension electrode that is formed on the base substrate and is connected to the first electrode; and a second extension electrode that is formed on the base substrate and is connected to the second electrode.

According to an aspect of the invention, the thickness of the base substrate is less than 1.2 mm.

According to an aspect of the invention, the first and second extension electrodes are made of a material including copper.

According to an aspect of the invention, the area of the first extension electrode is larger than the area of the first electrode, and the area of the second extension electrode is larger than the area of the second electrode.

According to an aspect of the invention, the first electrode is arranged closer to the light emitting chip than the second electrode.

According to an aspect of the invention, the area of the first extension electrode is larger than the area of the second extension electrode.

According to an aspect of the invention, the printed circuit board further includes at least one heat radiation hole that penetrates the base substrate, and wherein the heat radiation hole is located in a region in which the first extension electrode is formed.

According to an aspect of the invention, the printed circuit board further includes a heat radiation member that is formed in a side opposite to a side on which the first extension electrode is formed in the base substrate.

According to an aspect of the invention, the first extension electrode is connected to the heat radiation member through the heat radiation hole.

The foregoing and/or other aspects of the present invention can be achieved by providing a display device including: a display panel on which an image is displayed; and at least one light emitting diode module that supplies light to the display panel, the light emitting diode module including: a light emitting diode which includes a light emitting chip, a first electrode and a second electrode, the first and second electrodes being electrically connected to the light emitting chip; and a printed circuit board on which the light emitting diode is mounted, the printed circuit board including: a base substrate which includes an insulating resin material; a first extension electrode that is formed on the base substrate and is connected to the first electrode; and a second extension electrode that is formed on the base substrate and is connected to the second electrode.

According to an aspect of the invention, the thickness of the base substrate is less than 1.2 mm.

According to an aspect of the invention, the first and second extension electrodes are made of a material including copper.

According to an aspect of the invention, the area of the first extension electrode is larger than the area of the first electrode, and the area of the second extension electrode is larger than the area of the second electrode.

According to an aspect of the invention, the first electrode is arranged closer to the light emitting chip than the second electrode.

According to an aspect of the invention, the area of the first extension electrode is larger than the area of the second extension electrode.

According to an aspect of the invention, four light emitting diodes form one group, wherein four second extension electrodes respectively connected to the four light emitting diodes in the one group are arranged opposite to each other, and wherein four first extension electrodes respectively connected to the four light emitting diodes in the one group are arranged to surround the four second extension electrodes.

According to an aspect of the invention, the printed circuit board includes a multi-printed circuit board, and wherein the second extension electrodes are connected to circuit wires formed on layers different from the second extension electrodes.

According to an aspect of the invention, three light emitting diodes form one group, wherein three first extension electrodes and three second extension electrodes respectively connected to the three light emitting diodes in the one group are arranged at positions corresponding to apexes of a triangle, and wherein the three first extension electrodes extends outwardly from the center of the triangle.

According to an aspect of the invention, the printed circuit board includes a multi-printed circuit board, and wherein the second extension electrodes are connected to circuit wires formed on layers different from the second extension electrodes.

According to an aspect of the invention, the printed circuit board further includes at least one heat radiation hole that penetrates the base substrate, and wherein the heat radiation hole is located in a region in which the first extension electrode is formed.

According to an aspect of the invention, the printed circuit board further includes a heat radiation member that is formed in a side opposite to a side on which the first extension electrode is formed in the base substrate.

According to an aspect of the invention, the first extension electrode is connected to the heat radiation member through the heat radiation hole.

According to an aspect of the invention, the display device further includes a housing member that accommodates the light emitting diode module; and an insulating thermal-conductive member that is interposed between the housing member and the light emitting diode module.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Reference will now be made in detail to the embodiments of the present invention, examples of which are illustrated in the accompanying drawings, wherein like reference numerals refer to like elements throughout. The embodiments are described below so as to explain the present invention by referring to the figures.

In the following embodiments, the same components are denoted by the same reference numerals, and explanation thereof will be representatively given in a first exemplary embodiment but not repeated in other exemplary embodiments.

Figure 1:
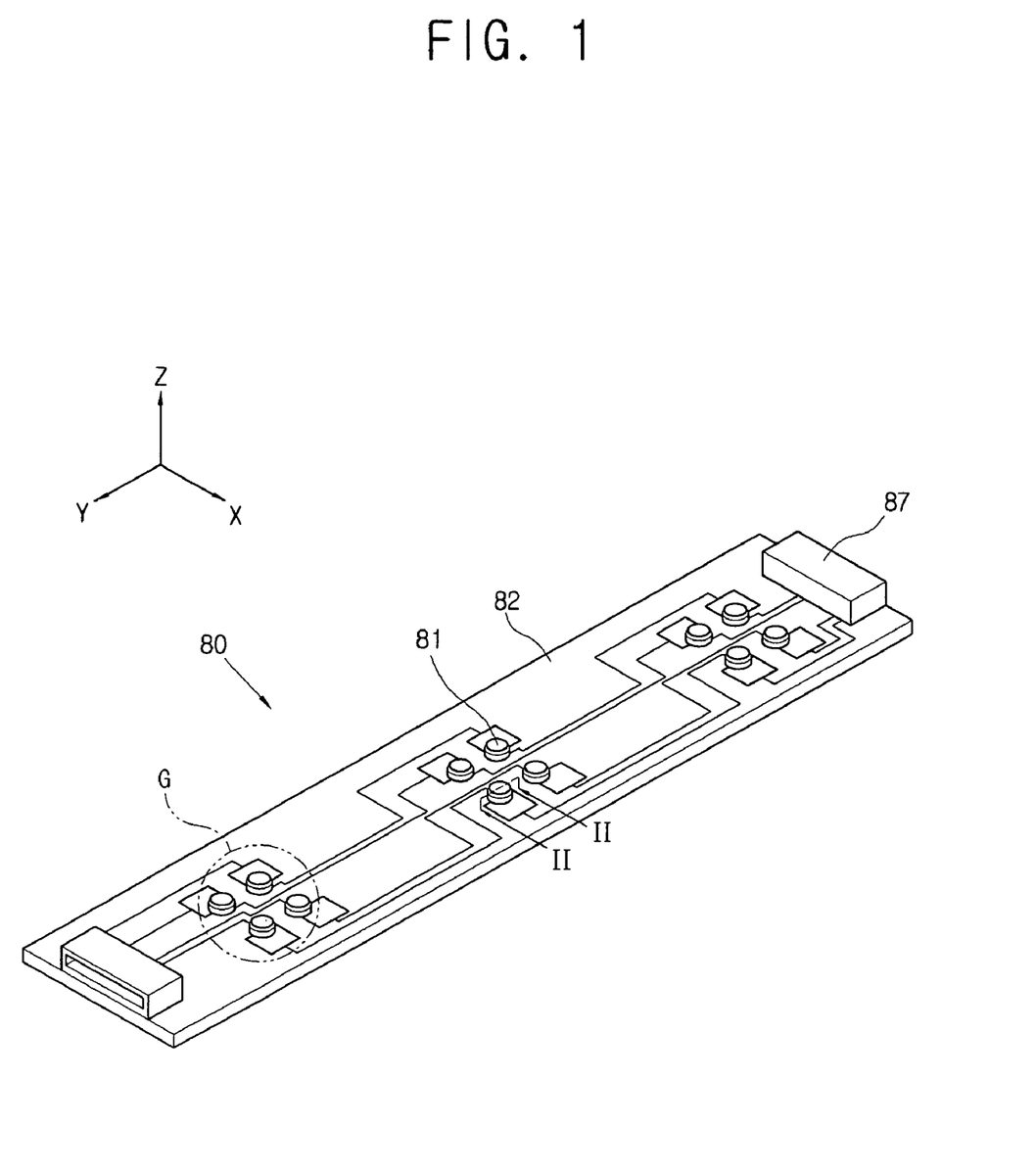
FIG. 1 is a perspective view of a light emitting diode module according to a first exemplary embodiment of the present invention.

As shown in FIG. 1, a light emitting diode module 80 includes a plurality of light emitting diodes 81 and a printed circuit board 82 on which the plurality of light emitting diodes 81 are mounted. The light emitting diode module 80 further includes a connector 87 that electrically connects the printed circuit board 82 to the outside. The connector 87 is connected with a wire or a cable through which power and signals are applied from the outside.

The predetermined number of light emitting diodes 81 form one light emitting group G, and a plurality of light emitting groups G are formed on the printed circuit board 82. FIG. 1 shows that four light emitting diodes 81 that emit red, green and blue primary color light are provided as one light emitting group G. In this case, since the green color light has luminance lower than the red and blue color light, two light emitting diodes 81 that emit the green color light are arranged in the light emitting group G so as to supplement the low luminance.

The light emitting diodes 81 do not necessarily emit only the red, green and blue primary color light, but different light emitting diodes 81 that emit different color light may be used in various ways. The plurality of light emitting diodes 81 may be driven in a sequential driving manner.

Figure 2:
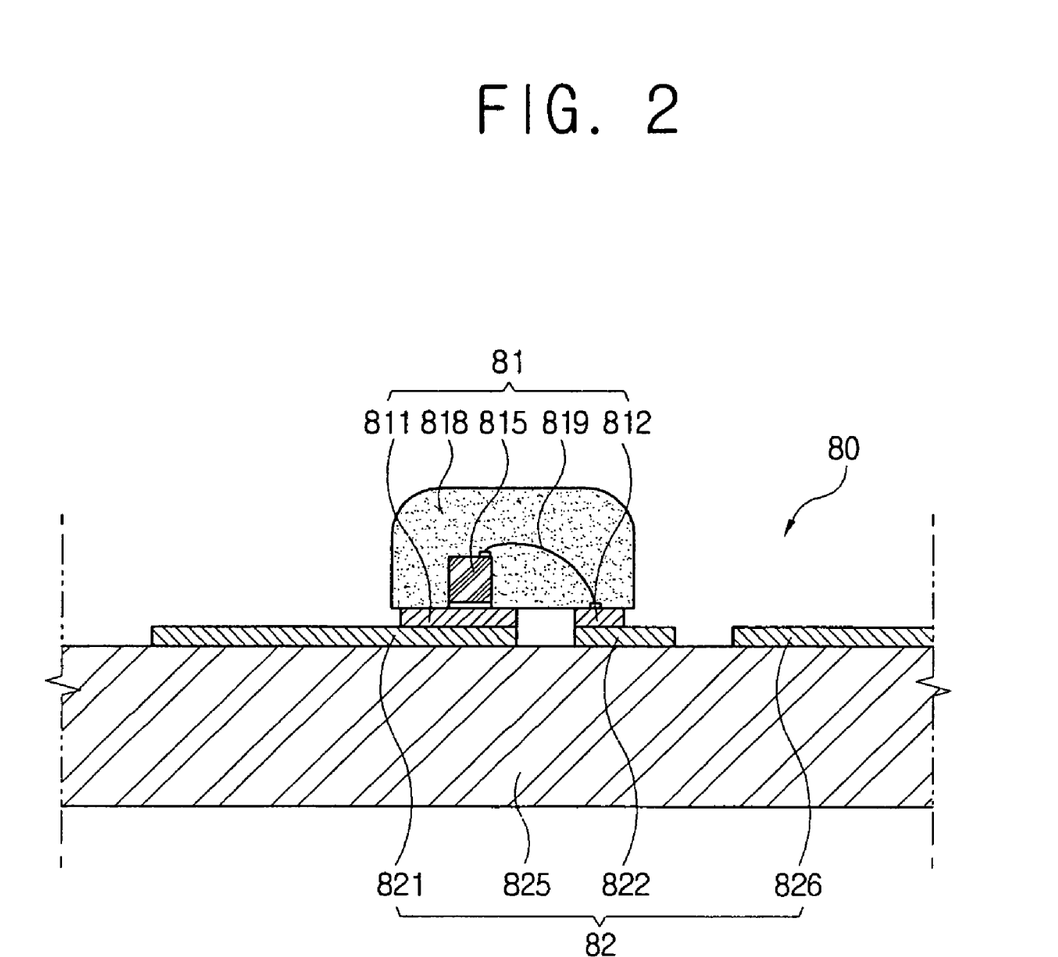
FIG. 2 is a cross-sectional view taken along line II-II of FIG. 1.

The light emitting diode module 80 according to the first exemplary embodiment of the present invention is described below in more detail with reference to FIGS. 2 and 3. FIG. 2 shows a cross-section of a light emitting diode 81 mounted on the printed circuit board 82.

As shown in FIG. 2, the light emitting diode 81 includes a light emitting chip 815 and first and second electrodes 811 and 812 which are electrically connected to the light emitting chip 815. The light emitting diode 81 further includes a cover 818 that surrounds the light emitting chip 81. The cover 818 is made of a transparent resin material, for example, an epoxy resin.

The light emitting chip 815 is arranged closer to the first electrode 811 than the second electrode 812. The light emitting chip 815 is arranged in substantial contact with the first electrode 811. The light emitting chip 815 is connected to the second electrode 812 via an internal wire 819. The first electrode 811 has an area larger than the second electrode 812.

The printed circuit board 82 includes a base substrate 825, a first extension electrode 821 that is formed on the base substrate 825 and is connected to the first electrode 811 of the light emitting diode 81, and a second extension electrode 822 that is formed on the base substrate 825 and is connected to the second electrode 812 of the light emitting diode 81. The printed circuit board 82 further includes a circuit wire 826 that is formed on a surface on which the first extension electrode 821 and the second extension electrode 822 are formed.

The base substrate 825 is made of an insulating resin material, for example, an inexpensive epoxy resin, however other insulating materials may alternatively be utilized.

The first extension electrode 821, the second extension electrode 822 and the circuit wire 826 have good thermal conductivity and electrical conductivity and are made of a copper (Cu) material which is relatively inexpensive but other electrical conductor materials may be used.

Figure 3:
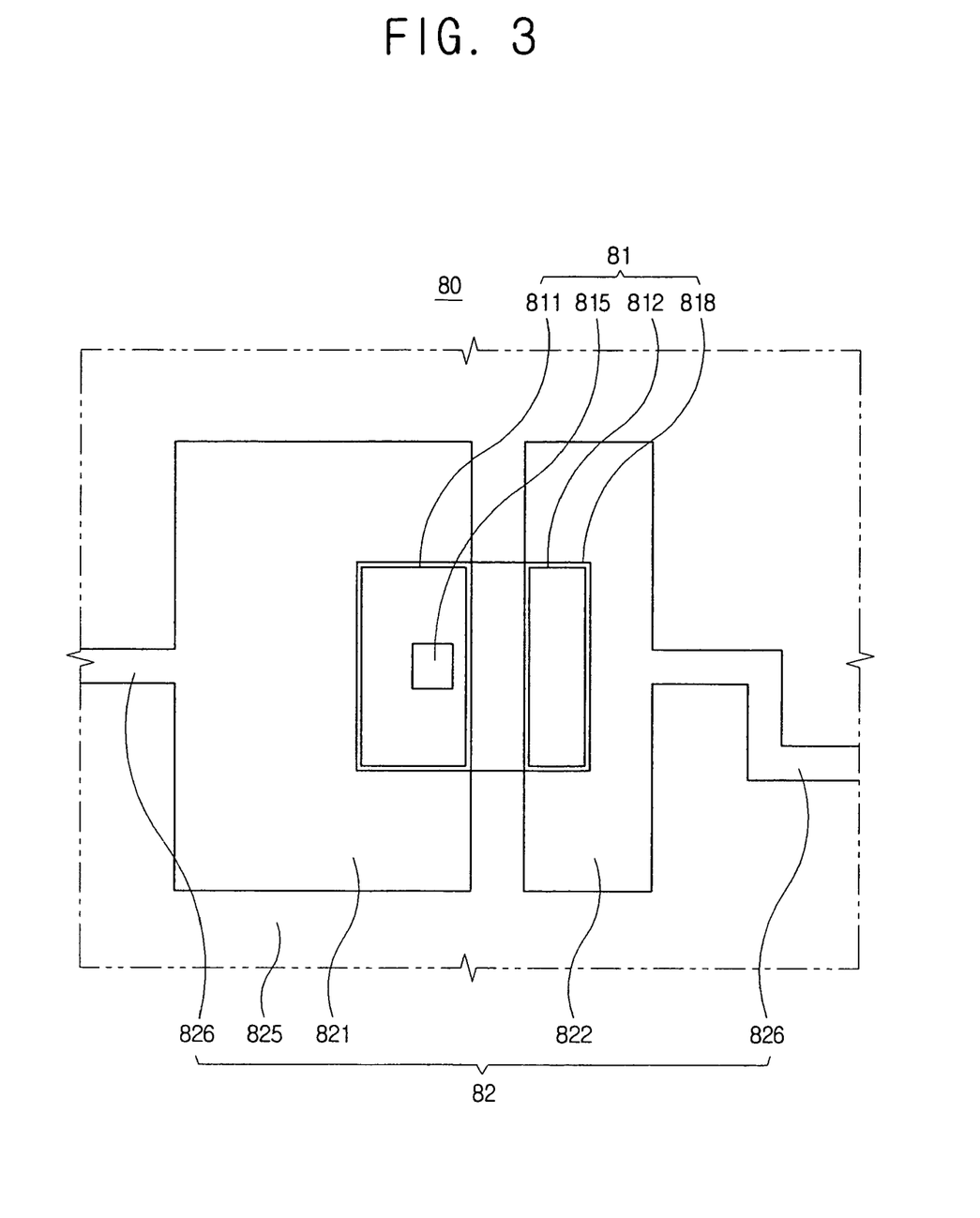
FIG. 3 is a plan view showing a state where a light emitting diode shown in FIG. 1 is mounted on a light source circuit board.

FIG. 3 shows an arrangement of the printed circuit board 82 on which the light emitting diode 81 is mounted.

As shown in FIG. 3, the first extension electrode 821 has an area lager than the first electrode 811, and the second extension electrode 822 has an area larger than the second electrode 812. The circuit wire 826 is connected to the first extension electrode 821 and the second extension electrode 822 and supplies a driving voltage to the light emitting diode 81.

The first extension electrode 821 and the second extension electrode 822 radiate heat generated in the light emitting diode 81, specifically, the light emitting chip 815. That is, the first extension electrode 821 and the second extension electrode 822 absorb heat generated in the light emitting chip 825 through the first electrode 811 and the second electrode 812 and radiate the heat to the outside. Accordingly, it is advantageous to make the first extension electrode 821 and the second extension electrode 822 wider in a range in which they do not have an effect on the circuit wire 826.

In addition, since the light emitting chip 815 is arranged adjacent to the first electrode 811, the heat is more effectively radiated as the first extension electrode 821 connected to the first electrode 811 becomes larger in its area. Accordingly, the first extension electrode 811 is formed to be larger than the second extension electrode 822.

In this manner, by increasing the area of the first and second extension electrodes 821 and 822 of the printed circuit board 82, which are respectively connected to the first and second electrodes 811 and 812 of the light emitting diode 81, the heat generated in the light emitting chip 815 of the light emitting diode 81 can be effectively radiated.

The base substrate 825 has a thickness of less than 1.2 mm. The heat generated in the light emitting chip 815 of the light emitting diode 81 is radiated through the first and second extension electrodes 821 and 822 respectively connected to the first and second electrodes 811 and 812. The heat is primarily conducted through the first and second extension electrodes 821 and 822, and secondarily is conducted and radiated through the base substrate 825 contacting the first and second extension electrodes 821 and 822. Accordingly, if the thickness of the base substrate 825 is more than 1.2 mm, the secondary conduction through the base substrate 825 having relative low thermal conductivity is not well done, which results in deterioration of the heat radiation efficiency.

In addition, the printed circuit board 82 is made of a relatively inexpensive resin material, not a relatively expensive material used in a metal core printed circuit board (MCPCB). Accordingly, the light emitting diode module 80 can be manufactured with increased productivity as well as improved heat radiation efficiency.

Figure 4:
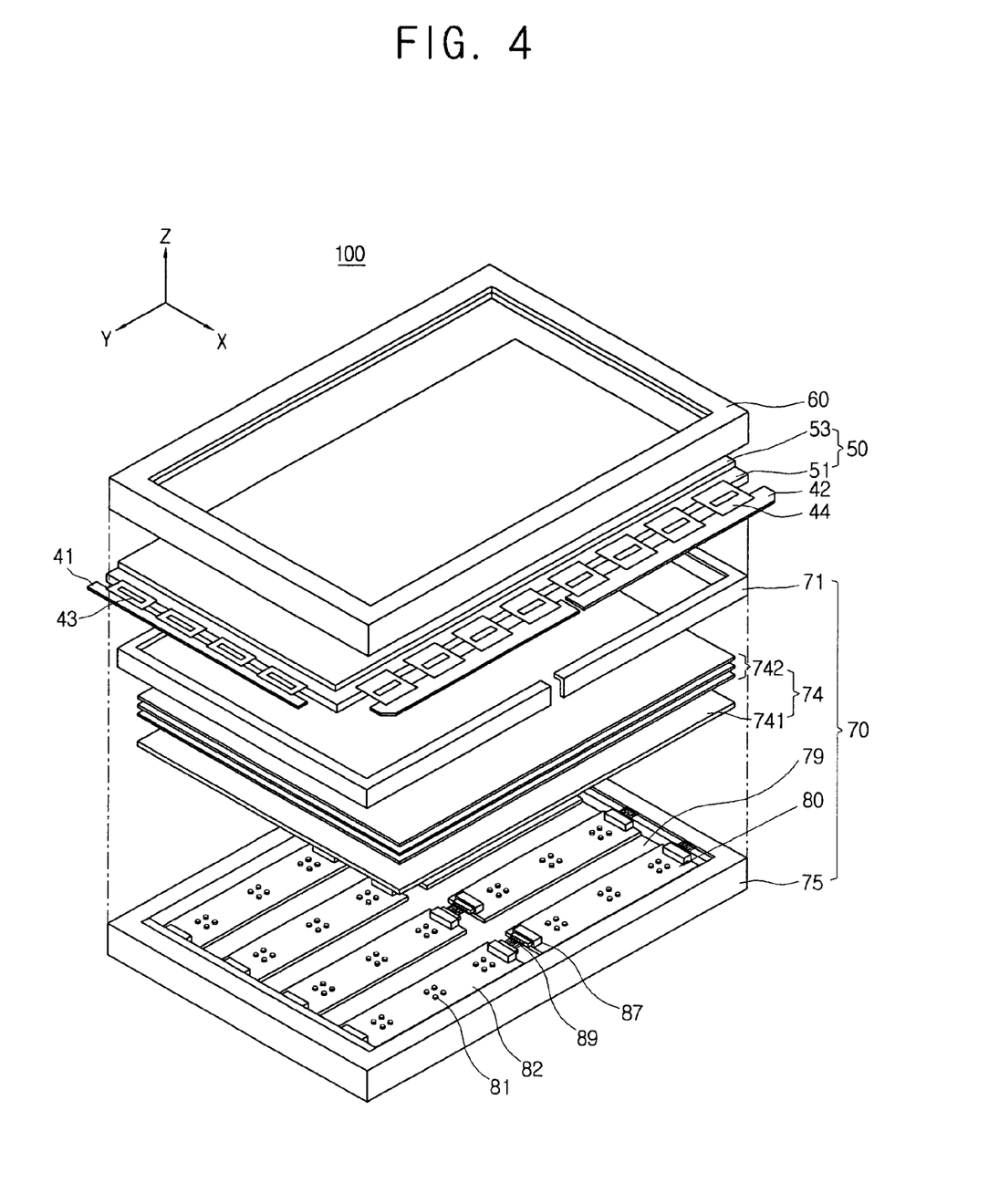
FIG. 4 is an exploded perspective view of a display device having the light emitting diode module of FIG. 1.

FIG. 4 shows the display device 100 having the light emitting diode module 80 of FIG. 1.

Although FIG. 4 shows a liquid crystal display panel as an example of the display panel 50 used for the display device 100, various different display panels may be used for the display device 100 without departing from the spirit and scope of the present invention.

As shown in FIG. 4, the display device 100 includes a backlight assembly 70 that supplies light, and the display panel 50 that receives the light from the backlight assembly 70 and displays an image, a holding member 60 that holds the display panel 50 on the backlight assembly 70, and other necessary members.

In addition, the display device 100 includes a plurality of driving integrated circuit chip packages 43 and 44, which are electrically connected to the display panel 50 and transmit driving signals, and a plurality of driving printed circuit boards 41 and 42. In this embodiment, the driving integrated circuit chip packages 43 and 44 may be formed of chip-on-film (COF) packages or tape carrier (TCP) packages.

The driving integrated circuit chip packages 43 and 44 include gate driving integrated circuit chip packages 43 and data driving integrated circuit chip packages 44. The gate driving integrated circuit chip packages 43 are attached to one side of the display panel 50 and supply gate signals to the display panel 50. The data driving integrated circuit chip packages 44 are attached to the other side of the display panel 50, which is adjacent to the one side, and supply other signals including data signals to the display panel 50.

The backlight assembly includes the light emitting diode (LED) module 80 shown in FIG. 1, and an optical member 74. The backlight assembly 70 further includes a reflecting sheet 79, a supporting member 71, a housing member 75, and other necessary members.

The housing member 75 accommodates the light emitting diode module 80, the optical member 74, the reflecting sheet 79, etc. The supporting member 71 is joined to the housing member 75, thereby holding the optical member 74. In addition, the supporting member 71 supports an edge of the display panel 50 and separates the display panel 50 from the optical member 74 by a predetermined distance. Thus, a luminance distribution of light emitted from the backlight assembly 70 to the display panel 50 can become more uniform. Although FIG. 4 shows that the supporting member 71 is divided into two 'ᴄ'-like members, the supporting member 71 is not limited to this, but may be formed as a monolithic supporting member 71.

In addition, although FIG. 4 shows that both of the housing member 75 and the supporting member 71 are used, the present invention is not limited to this. For example, the supporting member 71 may be omitted. In this case, the housing member 75 directly supports the display panel 50.

The housing member 75 is made of a metallic material.

The optical member 74 includes a diffusion plate 741 that diffuses light emitted from the light emitting diode module 80, and optical sheets 742 that increase luminance of light that passes through the diffusion plate 741. The optical sheets 742 include various functional sheets such as a diffusion sheet, a prism sheet, a luminance enhancement sheet, a protective sheet and the like.

The reflecting sheet 79 is arranged at the bottom of the housing member 75 and again reflects some of light, which was emitted from the light emitting diode module 80 and then was reflected by the optical member 74. That is, the reflecting sheet 79 reflects the light emitted from the light emitting diode module 80 so that the light travels toward the front side, thereby reducing light loss. This assists in diffusing the light and contributes to improvement of light uniformity. If another reflecting sheet is arranged in the front side of the printed circuit board 82, reflection efficiency can be further increased.

Figure 5:
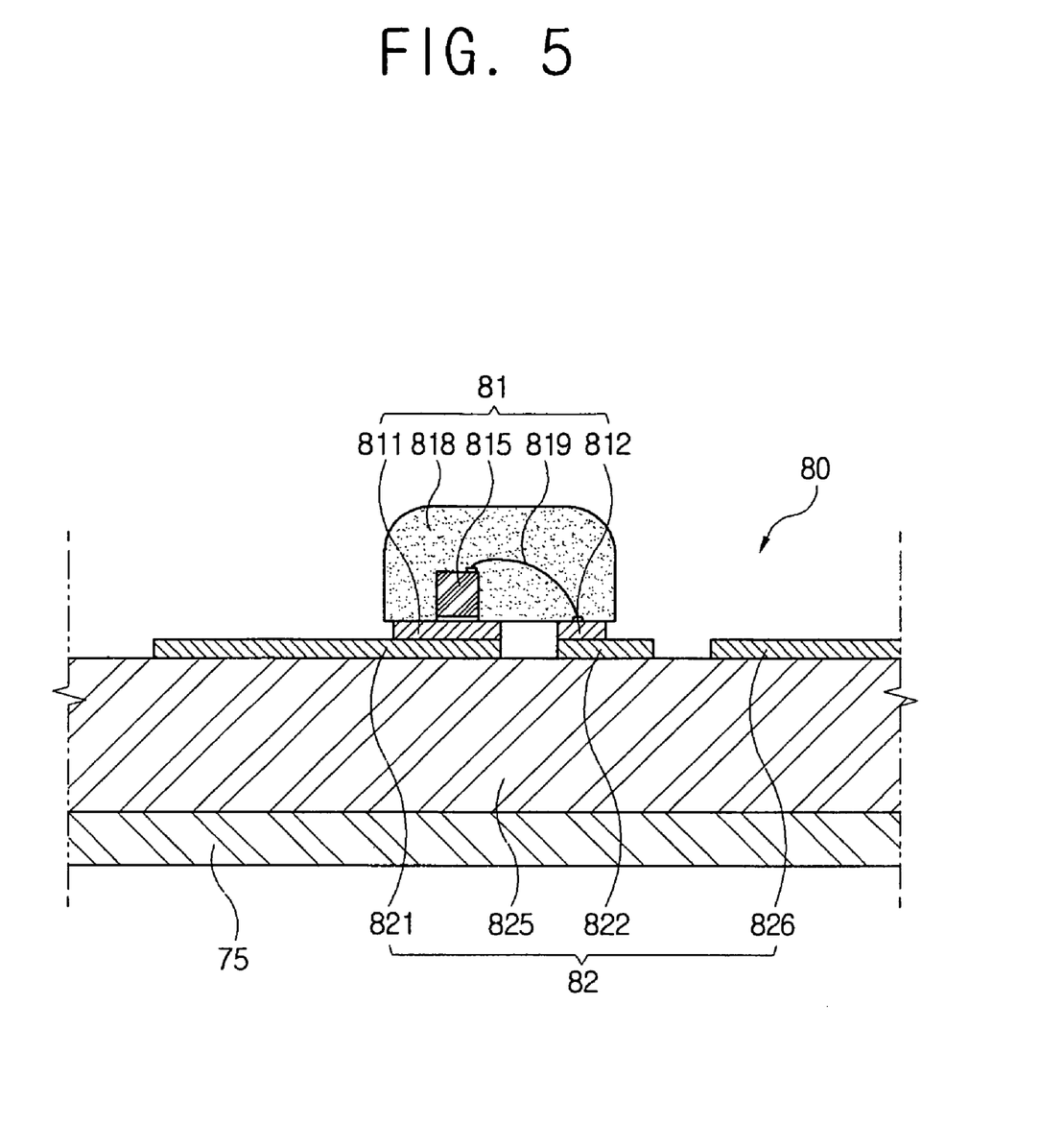
FIG. 5 is a partial cross-sectional view of the light emitting diode module accommodated in a housing member.

As shown in FIG. 5, the light emitting diode module 80 is accommodated in the housing member 75 in such a manner that the light emitting diode module 80 contacts the bottom of the housing member 75. Accordingly, heat generated in the light emitting diode 81 is primarily conducted through the first and second extension electrodes 821 and 822, secondarily conducted through the base substrate 825, and thirdly conducted and radiated through the housing member 75. In addition to the conductive radiation, it should be understood that convective radiation due to ambient air can occur in the first and second extension electrodes 821 and 822 and the base substrate 825.

Although FIG. 4 shows that a plurality of light emitting diode modules 80 are interconnected by cables 89, the present invention is not limited to this. For example, only one light emitting diode module 80 may be used. In this case, the light emitting diode module 80 may include one printed circuit board 82 corresponding to the size of the bottom of the housing member 75, and a plurality of light emitting diodes 81 which are formed on the printed circuit board 82.

In addition, although not shown, the display device 100 further includes an inverter circuit board, which is arranged in the rear side of the housing member 75.

The inverter circuit board drives the light emitting diode module 80 by transforming external power into a predetermined level of voltage and supplying the transformed voltage to the light emitting diode module 80. The inverter circuit board may drive the light emitting diodes 81 of the light emitting diode module 80 in various ways. For example, the inverter circuit board may cause all of the light emitting diodes 81 to emit light simultaneously. Alternatively, the light emitting diodes 81 that emit different color light may be driven in a sequential manner. In addition, the light emitting diodes 81 that emit different color light may be driven to have different luminance for different colors.

If the light emitting diodes 81 that emit different color light are driven in the sequential manner, color filters may be omitted from the display panel 50.

The control circuit board 48 is electrically connected to the driving printed circuit board 42 through a connecting member (not shown) and supplies signals required to display an image on the display panel 50.

With this configuration, the display device 100 can be manufactured with improved heat radiation efficiency and increased productivity.

A second exemplary embodiment of the present invention is described below with reference to FIG. 6.

Figure 6:
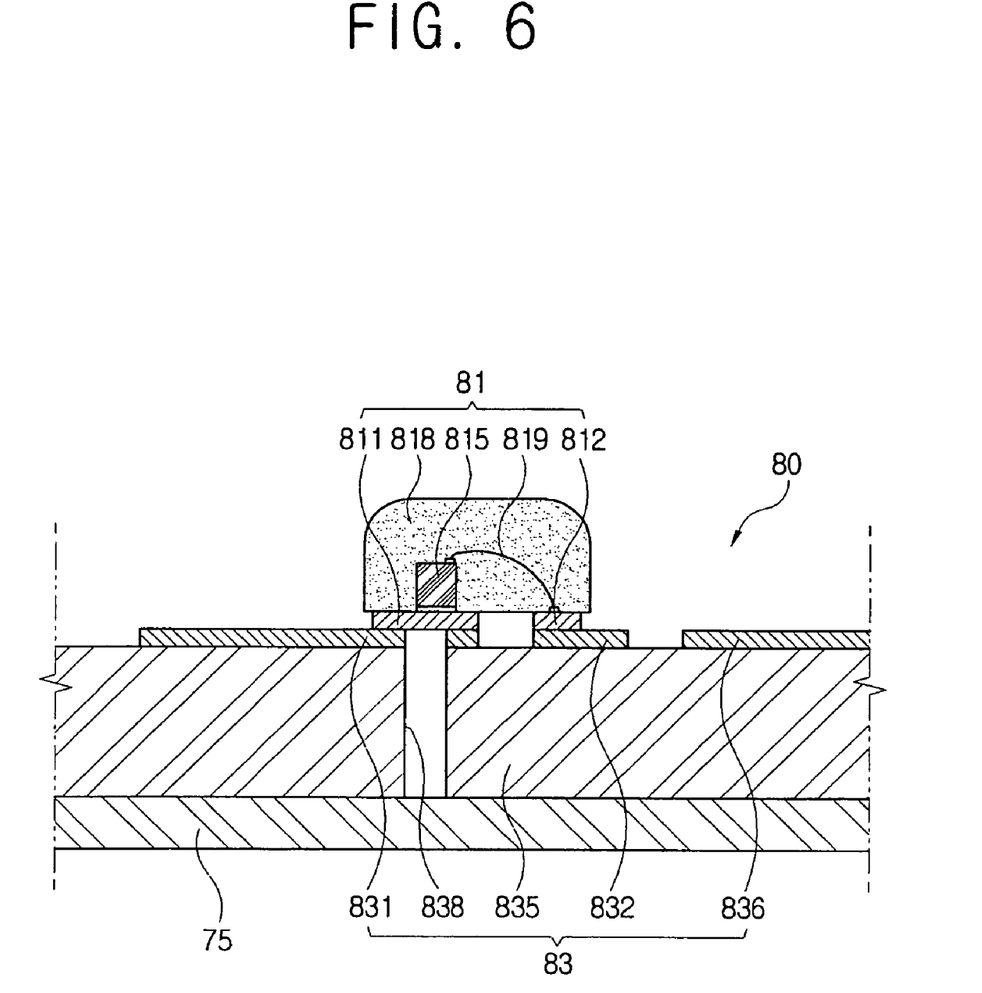
FIG. 6 is a partial cross-sectional view showing the structure where a light emitting diode module according to a second exemplary embodiment of the present invention is accommodated in a housing member.

As shown in FIG. 6, a printed circuit board 83 further includes one or more heat radiation holes 838 that penetrate a base substrate 835. The heat radiation hole 838 is located in a region where a first extension electrode 831 is formed. One relatively large heat radiation hole 838 may be formed or a plurality of relatively small heat radiation holes 838 may be formed. The first extension electrode 831 may cover the heat radiation hole 838 or may be opened to expose the heat radiation hole 838.

With this configuration, heat generated in the light emitting chip 815 of the light emitting diode 81 can be more efficiently radiated through the first extension electrode 831, a second extension electrode 832 and the heat radiation hole 838. That is, the heat generated in the light emitting chip 815 can be efficiently transmitted to the housing member 75 through the heat radiation hole 838. A reference numeral 836 denotes a circuit wire.

A third exemplary embodiment of the present invention is described below with reference to FIG. 7.

Figure 7:
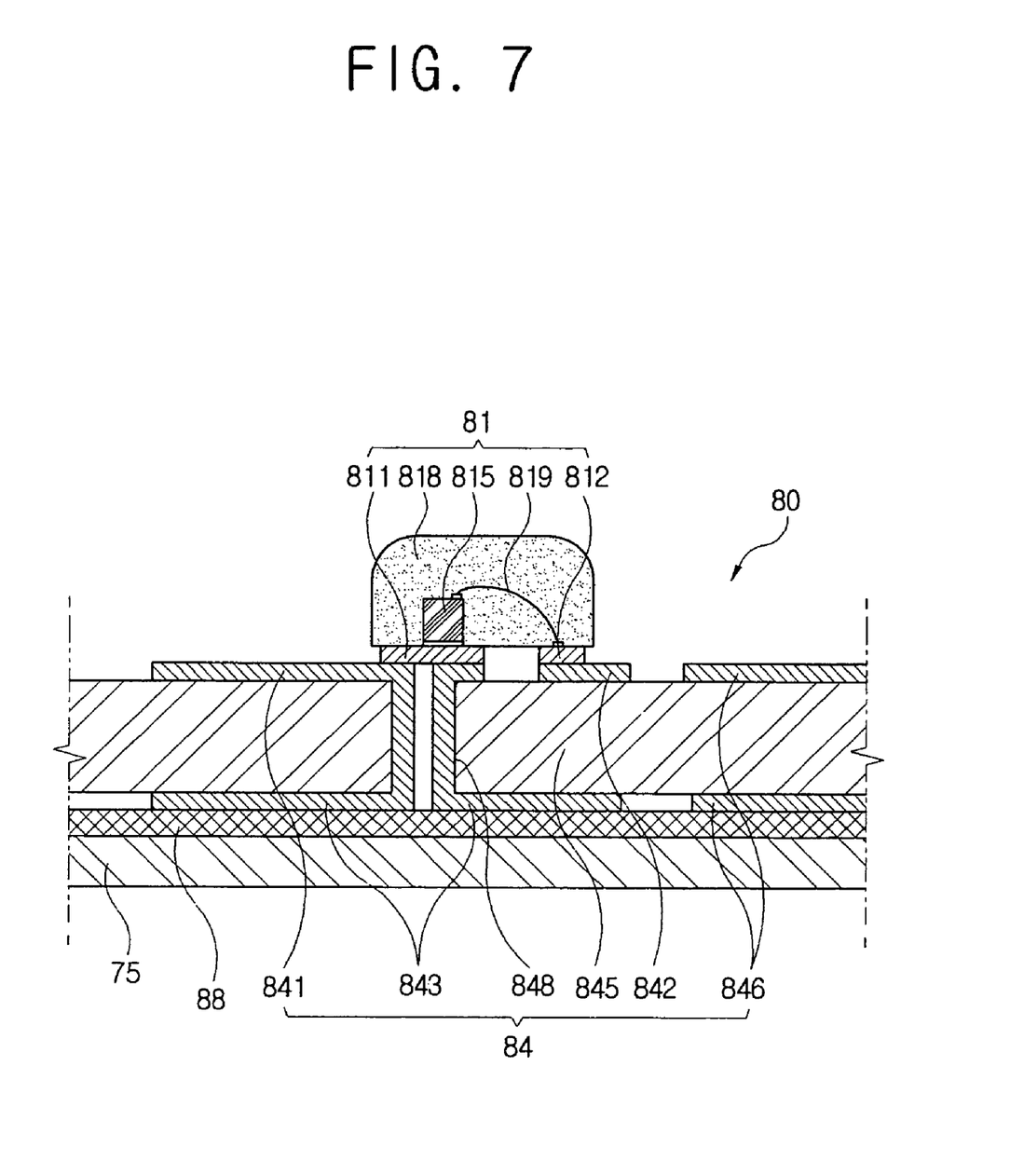
FIG. 7 is a partial cross-sectional view showing the structure of a light emitting diode module and the associated housing thereof for the third exemplary embodiment of the present invention.

As shown in FIG. 7, a printed circuit board 84 includes a base substrate 845, a first extension electrode 841 that is formed on the base substrate 845 and is connected to the first electrode 811 of the light emitting diode 81, a second extension electrode 842 that is formed on the base substrate 845 and is connected to the second electrode 812 of the light emitting diode 81, a heat radiation hole 848 that penetrates the base substrate 845, and heat radiation members 843 that are formed on the base substrate 845 in the sides opposite to sides on which the first and second extension electrodes 841 and 842 are formed. Herein, the heat radiation members 843 may have a shape of a film. In this embodiment, the heat radiation hole 848 is located in a region in which both of the heat radiation members 843 and the first extension electrode 841 are formed. In addition, the first extension electrode 841 and the heat radiation members 843 are interconnected via the heat radiation hole 848. In addition, the printed circuit board 84 further includes circuit wires 846 which are respectively formed on a surface on which the first and second extension electrodes 841 and 842 are formed, and a surface on which the heat radiation members 843 are formed.

That is, a double-side printed circuit board in which wiring layers are formed on both sides is used as the printed circuit board 84. However, the present invention is not limited to this. For example, a multi printed circuit board in which one or more wiring layers are further formed within the base substrate 845 may be used as the printed circuit board 84.

In this manner, if the double-side or multi printed circuit board is used as the printed circuit board 84, one or more of the circuit wires 846 connected to the first and second extension electrodes 841 and 842 may be formed on layers different from the first and second extension electrodes 841 and 842. If the circuit wires 846 are formed on the different layers, it is possible to secure a space into which the first extension electrode 841 can be further extended.

The heat radiation members 843 may be made of the same material as the first and second extension electrodes 841 and 842 and the circuit wires 846. However, the present invention is not limited to this. For example, the heat radiation members 843 may be made of any thermal-conductive material.

In addition, the first extension electrode 841 and the heat radiation members 843 may cover the heat radiation hole 848 or may be opened to expose the heat radiation hole 848.

In addition, the display device 100 further includes an insulating thermal-conductive member 88 that is interposed between the heat radiation members 843 of the printed circuit board 84 and the housing member 75. The insulating thermal-conductive member 88 insulates the printed circuit board 84 from the housing member 75. In addition, the insulating thermal-conductive member 88 conducts heat well from the heat radiation members 843 to the housing member 75.

With this configuration, heat generated in the light emitting chip 815 of the light emitting diode 81 can be more efficiently radiated through the first and second extension electrodes 841 and 842, the heat radiation hole 848 and the heat radiation members 843. That is, the heat generated in the light emitting chip 815 can be efficiently transmitted to the housing member 75 through the heat radiation hole 848 and the heat radiation members 843.

Figure 8:
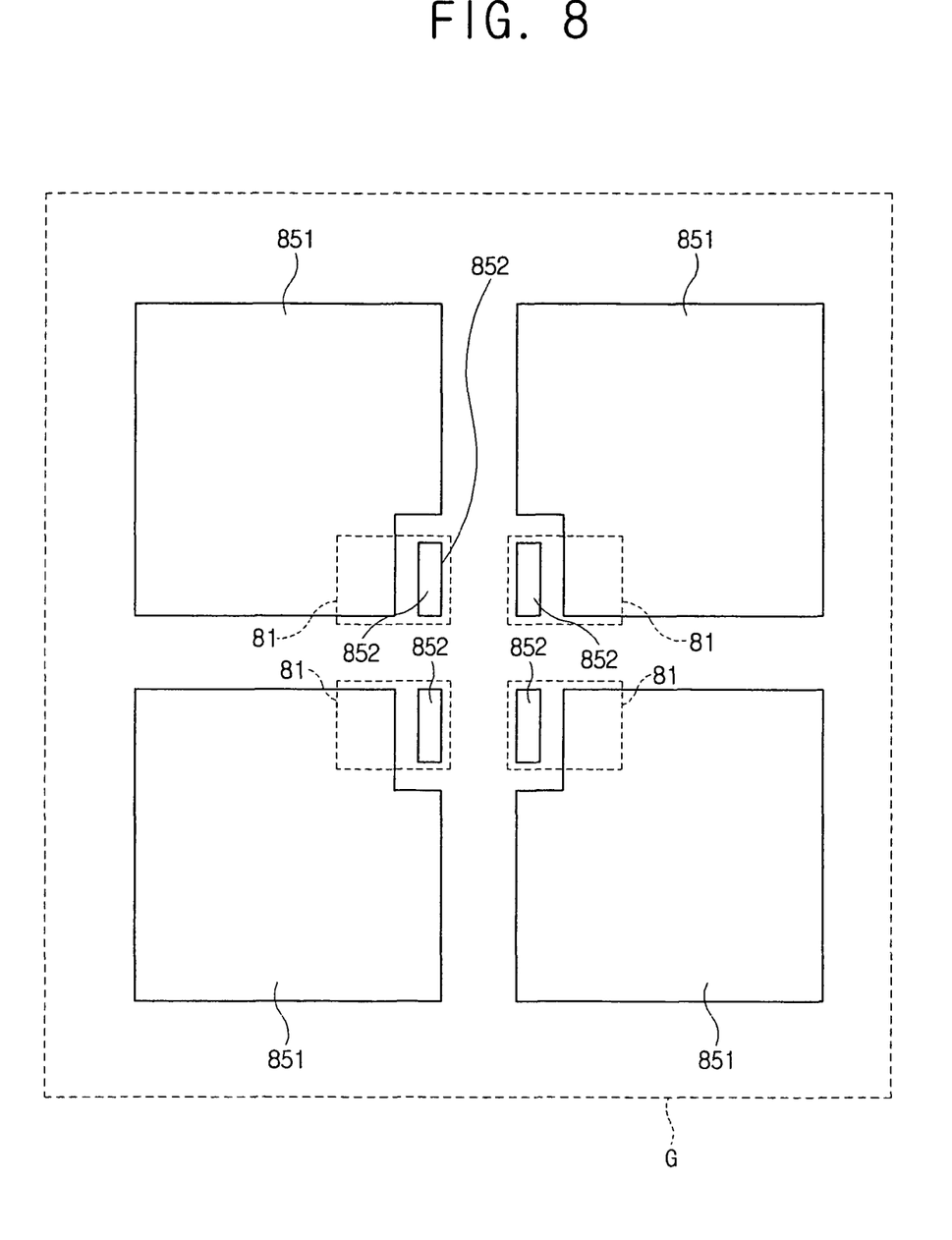
FIG. 8 is a plan view showing the arrangement of light emitting diodes according to a fourth embodiment of the present invention.

Now, a fourth exemplary embodiment of the present invention will be described with reference to FIG. 8. FIG. 8 shows an arrangement state of four light emitting diodes 81 that form one group G (shown in FIG. 1) in the light emitting diode module.

As shown in FIG. 8, four light emitting diodes 81 form one group G. Four first extension electrodes 851 and four second extension electrodes 852 to which the four light emitting diodes 81 in the one group G are connected are arranged to have a rectangular shape. Specifically, the four second extension electrodes 852 are located in the central portion of the rectangular shape in the opposite sides. The four first extension electrodes 851 are located in the outer side of the rectangular shape and surround the second extension electrodes 852.

With this configuration, in the case where the four light emitting diodes 81 form one group G, the first extension electrodes 851 can be extended as widely as possible, thereby improving heat radiation efficiency.

In addition, the printed circuit board on which the first and second extension electrodes 851 and 952 are formed may be the double-side or multi printed circuit board having various circuit wiring layers as shown in FIG. 7. If the double-side or multi-layer printed circuit board is used as the printed circuit board, the second extension electrodes 852 may be connected to the circuit wires formed on layers different from the second extension electrodes 852. In this manner, by forming the circuit wires connected to the second extension electrodes 852 on the layers different from the first and second extension electrodes 851 and 852, it is possible to secure a space into which the first extension electrodes 851 can be further extended, thereby further improving the heat radiation efficiency.

Figure 9:
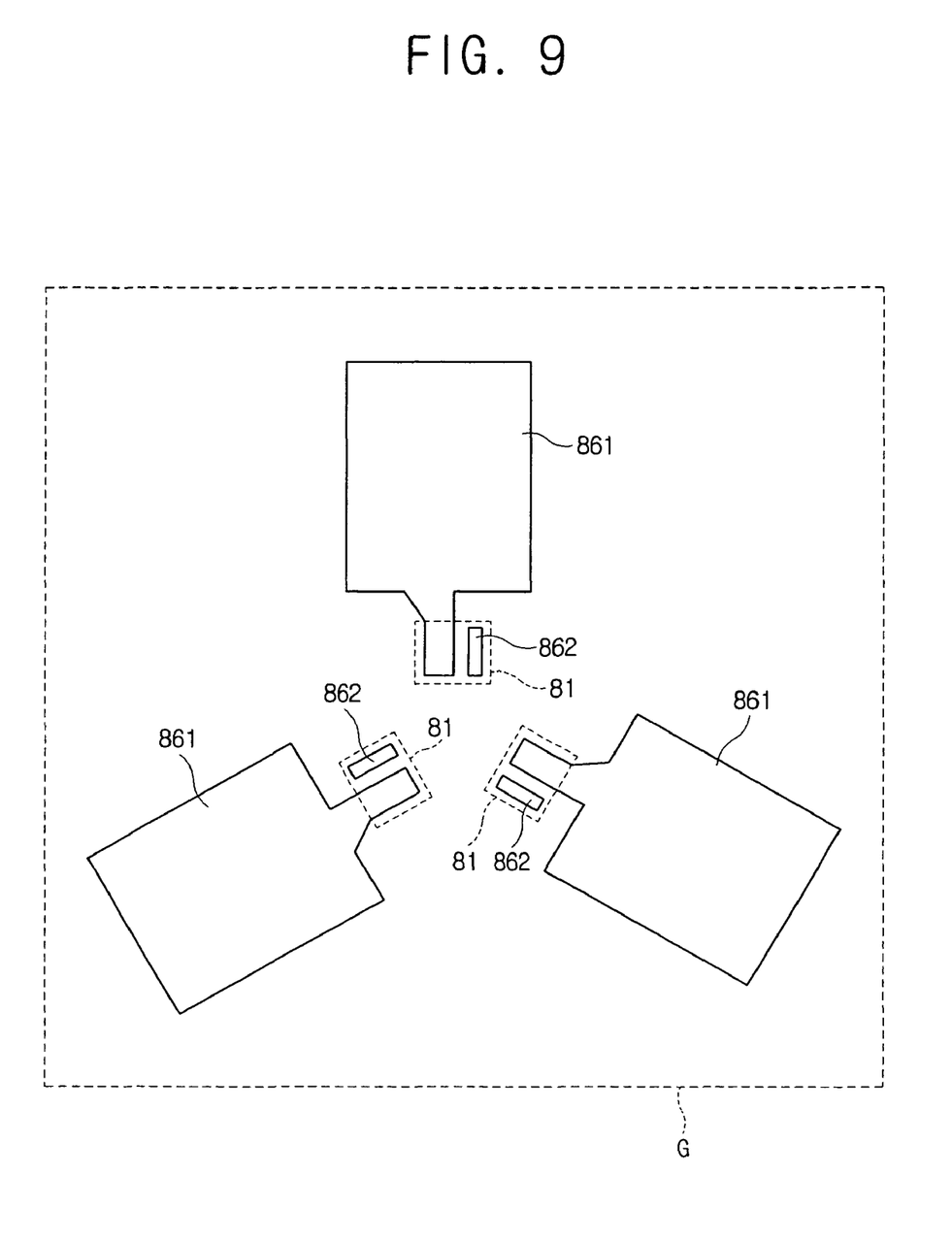
FIG. 9 is a plan view showing the arrangement of light emitting diodes according to a fifth embodiment of the present invention.

A fifth exemplary embodiment of the present invention is described below with reference to FIG. 9. FIG. 9 shows an arrangement state of three light emitting diodes 81 that form one group G (shown in FIG. 1) in the light emitting diode module.

As shown in FIG. 9, three light emitting diodes 81 form one group G. Three first extension electrodes 861 and three second extension electrodes 862 to which the three light emitting diodes 81 in the one group G are connected are arranged to have a triangular shape. Specifically, the three first extension electrodes 861 and the three second extension electrodes 862 are arranged at positions corresponding to apexes of a triangle. In addition, the three first extension electrodes 861 extend outwardly from the center of the triangle.

With this configuration, in the case where the three light emitting diodes 81 form one group G, the first extension electrodes 861 can be extended as widely as possible, thereby effectively improving heat radiation efficiency.

As apparent from the above description, the present invention provides a light emitting diode module with improved heat radiation efficiency and increased productivity.

Specifically, by forming the areas of the first and second extension electrodes of the printed circuit board to which the light emitting diodes are connected, it is possible to effectively radiate the heat generated in the light emitting chips of the light emitting diodes.

In addition, since the light emitting diode module can be made of a relatively inexpensive material, productivity can be increased.

In addition, it is possible to effectively radiate the heat generated in the light emitting chips of the light emitting diodes through the heat radiation hole formed on the printed circuit board.

In addition, it is possible to effectively radiate the heat generated in the light emitting chips of the light emitting diodes through the heat radiation members formed on the printed circuit board.

In addition, if a plurality of light emitting diodes forms one group, the first extension electrodes can be maximally extended, thereby improving the heat radiation efficiency.

Furthermore, the first extension electrodes can be maximally extended by forming the circuit wires connected to the second extension electrodes on the layers different from the first and second extension electrodes, thereby further improving the heat radiation efficiency.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A light emitting diode (LED) module comprising:
a light emitting diode which comprises a light emitting chip;
a first electrode and a second electrode, the first and second electrodes being electrically connected to the light emitting chip; and
a printed circuit board having the light emitting diode mounted thereon, wherein the printed circuit board comprises:
an insulating base substrate;
a first extension electrode formed on the base substrate and disposed under the first electrode, the first extension electrode being connected to the first electrode; and
a second extension electrode formed on the base substrate and disposed under the second electrode, the second extension electrode being connected to the second electrode.

2. The light emitting diode module according to claim 1, wherein the thickness of the base substrate is less than 1.2 mm.

3. The light emitting diode module according to claim 1, wherein the first and second extension electrodes are made of a material including copper.

4. The light emitting diode module according to claim 1, wherein an area of the first extension electrode is larger than an area of the first electrode, and an area of the second extension electrode is larger than an area of the second electrode.

5. The light emitting diode module according to claim 4, wherein the light emitting chip is positioned closer to the first extension electrode than to the second extension electrode.

6. The light emitting diode module according to claim 5, wherein the area of the first extension electrode is larger than the area of the second extension electrode.

7. The light emitting diode module according to claim 1, wherein the printed circuit board further comprises at least one heat radiation hole that penetrates the base substrate, and wherein the heat radiation hole is located in a region in which the first extension electrode is formed.

8. The light emitting diode module according to claim 7, wherein the printed circuit board further comprises a heat radiation member that is formed in a side opposite to a side on which the first extension electrode is formed in the base substrate.

9. The light emitting diode module according to claim 8, wherein the first extension electrode is connected to the heat radiation member through the heat radiation hole.

10. A display device comprising:
a display panel adapted to display an image; and
at least one light emitting diode module being operative to provide light to the display panel, the at least one light emitting diode module comprising:
a light emitting diode which comprises a light emitting chip;
a first electrode and a second electrode, the first and second electrodes being electrically connected to the light emitting chip; and a printed circuit board having the light emitting diode mounted thereon, wherein the printed circuit board comprises:

an insulating base substrate;

a first extension electrode formed on the base substrate and disposed under the first electrode, the first extension electrode being connected to the first electrode; and a second extension electrode formed on the base substrate and disposed under the second electrode, the second extension electrode being connected to the second electrode.

11. The display device according to claim 10, wherein the thickness of the base substrate is less than 1.2 mm.

12. The display device according to claim 10, wherein the first and second extension electrodes are made of a material including copper.

13. The display device according to claim 10, wherein an area of the first extension electrode is larger than an area of the first electrode, and an area of the second extension electrode is larger than an area of the second electrode.

14. The display device according to claim 13, wherein the light emitting chip is positioned closer to the first extension electrode than to the second extension electrode.

15. The display device according to claim 14, wherein the area of the first extension electrode is larger than the area of the second extension electrode.

16. The display device according to claim 10, wherein the at least one light emitting diode module comprises four light emitting diodes which form one group, wherein four second extension electrodes are respectively connected to the four light emitting diodes in the one group are arranged opposite to each other, and wherein four first extension electrodes respectively connected to the four light emitting diodes in the one group are arranged to surround the four second extension electrodes.

17. The display device according to claim 16, wherein the printed circuit board comprises a multi-printed circuit board, and wherein the second extension electrodes are connected to circuit wires formed on layers different from the second extension electrodes.

18. The display device according to claim 10, wherein three light emitting diodes form one group, wherein three first extension electrodes and three second extension electrodes respectively connected to the three light emitting diodes in the one group are arranged at positions corresponding to apexes of a triangle, and wherein the three first extension electrodes extend outwardly from the center of the triangle.

19. The display device according to claim 18, wherein the printed circuit board comprises a multi-layer printed circuit board, and wherein the second extension electrodes are connected to circuit wires formed on layers different from the second extension electrodes.

20. The display device according to claim 10, wherein the printed circuit board further comprises at least one heat radiation hole that penetrates the base substrate, and wherein the heat radiation hole is located in a region in which the first extension electrode is formed.

21. The display device according to claim 20, wherein the printed circuit board further comprises a heat radiation member that is formed in a side opposite to a side on which the first extension electrode is formed in the base substrate.

22. The display device according to claim 21, wherein the first extension electrode is connected to the heat radiation member through the heat radiation hole.

23. The display device according to claim 21, further comprising a housing member that accommodates the light emitting diode module; and an insulating thermal-conductive member that is interposed between the housing member and the light emitting diode module.

* * * * *